United States Patent
Ikebe et al.

(10) Patent No.: US 10,921,705 B2
(45) Date of Patent: Feb. 16, 2021

(54) MASK BLANK SUBSTRATE, SUBSTRATE WITH MULTILAYER REFLECTIVE FILM, REFLECTIVE MASK BLANK, REFLECTIVE MASK AND METHOD OF MANUFACTURING SEMICONDUCTOR DEVICE

(71) Applicant: HOYA CORPORATION, Tokyo (JP)

(72) Inventors: Yohei Ikebe, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 217 days.

(21) Appl. No.: 15/778,363

(22) PCT Filed: Nov. 15, 2016

(86) PCT No.: PCT/JP2016/083829
§ 371 (c)(1),
(2) Date: May 23, 2018

(87) PCT Pub. No.: WO2017/090485
PCT Pub. Date: Jun. 1, 2017

(65) Prior Publication Data
US 2018/0356719 A1    Dec. 13, 2018

(30) Foreign Application Priority Data

Nov. 27, 2015    (JP) ................................ 2015-231444

(51) Int. Cl.
| | | |
|---|---|---|
| *G03F 1/24* | (2012.01) | |
| *G03F 1/48* | (2012.01) | |
| *G03F 1/38* | (2012.01) | |
| *G03F 1/46* | (2012.01) | |
| *G03F 1/54* | (2012.01) | |
| *G03F 7/20* | (2006.01) | |

(52) U.S. Cl.
CPC .................. *G03F 1/24* (2013.01); *G03F 1/38* (2013.01); *G03F 1/46* (2013.01); *G03F 1/48* (2013.01); *G03F 1/54* (2013.01); *G03F 7/2004* (2013.01)

(58) Field of Classification Search
CPC ..... G03F 1/24; G03F 1/38; G03F 1/46; G03F 1/48; G03F 1/54
USPC ............................................................ 430/5
See application file for complete search history.

(56) References Cited

U.S. PATENT DOCUMENTS

| | | |
|---|---|---|
| 6,576,375 B1 | 6/2003 | Miyoshi et al. |
| 2003/0025991 A1 | 2/2003 | Takaki et al. |
| 2005/0238963 A1 | 10/2005 | Ishibashi et al. |
| 2009/0220869 A1 | 9/2009 | Takai |
| 2015/0331312 A1 | 11/2015 | Hamamoto et al. |

FOREIGN PATENT DOCUMENTS

| | | |
|---|---|---|
| JP | 63-204259 A | 8/1988 |
| JP | 2001-100393 A | 4/2001 |
| JP | 2001-194506 A | 7/2001 |
| JP | 2004-039884 A | 2/2004 |
| JP | 2009-212220 A | 9/2009 |
| JP | 2010-080659 A | 4/2010 |
| JP | 2012-204708 A | 10/2012 |
| JP | 2013-187412 A | 9/2013 |
| JP | 2014-229652 A | 12/2014 |
| JP | 2015-028999 A | 2/2015 |
| JP | 2015-082553 A | 4/2015 |
| TW | 201432369 A | 8/2014 |

OTHER PUBLICATIONS

International Search Report for PCT/JP2016/083829 dated Feb. 21, 2017 [PCT/ISA/210].
JP2017-552370, "Notice of Reasons for Refusal" and Machine Translation, dated May 26, 2020, 4 pages.
TW105138561, Office Action dated Aug. 27, 2020, 7 pages.

*Primary Examiner* — Christopher G Young
(74) *Attorney, Agent, or Firm* — Kilpatrick Townsend Stockton LLP

(57) ABSTRACT

Provided is a reflective mask capable of reducing out-of-band light when transferring a prescribed pattern onto a wafer by exposure using EUV light in a process of manufacturing a semiconductor device. The mask blank substrate is provided with a base film on a substrate, the base film is formed with a material having a refractive index smaller than the substrate over a wavelength range of not less than 190 nm and not more than 280 nm, and reflectance of the base film arranged on the surface of the substrate is smaller than the reflectance of the substrate over a wavelength range of not less than 190 nm to not more than 280 nm.

16 Claims, 4 Drawing Sheets

MASK BLANK SUBSTRATE, SUBSTRATE WITH MULTILAYER REFLECTIVE FILM, REFLECTIVE MASK BLANK, REFLECTIVE MASK AND METHOD OF MANUFACTURING SEMICONDUCTOR DEVICE

CROSS REFERENCE TO RELATED APPLICATIONS

This application is a National Stage of International Application No. PCT/JP2016/083829 filed Nov. 15, 2016, claiming priority based on Japanese Patent Application No. 2015-231444 filed Nov. 27, 2015.

TECHNICAL FIELD

The present invention relates to a reflective mask used to manufacture a semiconductor device, and a mask blank substrate, substrate with multilayer reflective film and reflective mask blank used to fabricate a reflective mask. In addition, the present invention relates to a method of manufacturing a semiconductor device that uses the aforementioned reflective mask.

BACKGROUND ART

The types of light sources of exposure apparatuses used in the manufacturing of semiconductors are evolving while gradually becoming shorter, as is indicated by the g-line having a wavelength of 436 nm, i-line having a wavelength of 365 nm, KrF lasers having a wavelength of 248 nm and ArF lasers having a wavelength of 193 nm. EUV lithography using extreme ultraviolet (EUV) light, in which the wavelength of the light source of the exposure apparatus is in the vicinity of 13.5 nm, is being developed in order to realize transfer of even finer patterns. In EUV lithography, a reflective mask is used instead of a light-transmitting mask since there are few materials that are transparent to EUV light. This reflective mask typically has a structure in which a multilayer reflective film that reflects exposure light is formed on a low thermal expansion substrate and a desired transfer pattern is formed on a protective film for protecting this multilayer reflective film.

Transfer patterns consist of phase shift film types (halftone phase shift types), which reflect a certain amount of EUV light, and absorber film types (binary types), which absorb EUV light comparatively strongly. However, even absorber film types that absorb a large amount of EUV light and demonstrate a relatively small amount of reflected light reflect about 0.5% of EUV light. Consequently, EUV reflective masks are required to be provided with a dedicated light shielding band to adequately reduce the effects of the reflection of exposure light attributable to exposure carried out adjacent thereto not only in the case of phase shift film types, but also in the case of absorber film types. Here, a light shielding band refers to a light shielding frame (region) provided so as to surround the circuit pattern region of a mask. The light shielding band is provided to prevent escape of exposure light into a region adjacent to the block where a pattern is transferred onto a wafer, such as a circuit pattern region formed by being transferred adjacent thereto. In the case reflected light is unable to be adequately reduced with this light shielding band, the adjacent region ends up being exposed to exposure light, resulting in problems such as decreased resolution of the pattern in that adjacent region or decreased transfer dimensional accuracy, and causing a decrease in yield. In the case of EUV reflective masks, since reflected light increases if the light shielding band is simply formed with a phase shift film and absorber film alone, thereby inducing the aforementioned problems, light shielding bands are used that demonstrate adequate light shielding performance.

A typical light shielding band of a reflective mask is an engraved light shielding band having a multilayer reflective film of the light shielding band portion etched therein (to also be suitably referred to as a "multilayer reflective film-engraved light shielding band"). This method is advantageous from the viewpoints of forming of a precise transfer pattern, reducing the occurrence of defects, and preventing shadowing effects caused by laminated light shielding band films, compared to the exposure band of a laminated absorber type, which is obtained by further laminating an absorber film for the light shielding band on the absorber film for the transfer pattern.

Technologies relating to a reflective mask for EU lithography and mask blanks for the fabrication thereof are disclosed in Patent Documents 1 to 3. In addition, Patent Document 1 discloses matters relating to a light shielding band and shadowing effects.

Patent Document 4 discloses a reflective mask blank used in lithography that uses light having a wavelength of 5 nm to 15 nm as exposure light, the reflective mask blank having a substrate, a transparent conductive layer formed on the substrate, a multilayer reflective layer (multilayer reflective film) that reflects exposure light formed on the transparent conductive layer, a protective layer (protective film) that protects the multilayer reflective layer formed on the multilayer reflective layer, an absorber layer that absorbs exposure light formed on the protective layer, and a back side conductive layer (back side conductive film) formed on the opposite side of the substrate from the multilayer reflective layer.

PRIOR ART DOCUMENTS

Patent Documents

Patent Document 1: JP 2009-212220 A
Patent Document 2: JP 2010-080659 A
Patent Document 3: JP 2004-39884 A
Patent Document 4: JP 2014-229652 A

DISCLOSURE OF THE INVENTION

Problems to be Solved by the Invention

Vacuum ultraviolet light and ultraviolet light (wavelength: 190 nm to 400 nm), referred to as out-of-band (OoB) light, are known to be generated in the case of using EUV light as exposure light. Since the substrate is exposed in the light shielding band region in an EUV lithography reflective mask (to be simply referred to as the "reflective mask") of the previously described multilayer reflective film-engraved light shielding band type, out-of-band light contained in the exposure light ends up being reflected on the substrate surface or reflected, through the substrate, on a conductive film provided on the back side of the substrate. Since adjacent circuit pattern regions are exposed multiple times, the integrated value of the amount of reflected out-of-band light becomes so large that it cannot be ignored. Consequently, the problem occurs whereby the out-of-band light ends up having an effect on the dimensions of the wiring pattern.

Patent Document 4 describes a reflective mask blank having a transparent conductive layer, such as oxides of indium tin oxide (ITO), zinc oxide, tin oxide and molybdenum silicide (MoSi), nitride or oxynitride, between a substrate and multilayer reflective layer (multilayer reflective film). Patent Document 4 describes that reduction and attenuation of out-of-band surface reflectance in the region of the light shielding frame occur due to the presence of this transparent conductive layer.

With the foregoing in view, an object of the present invention is to provide a reflective mask capable of reducing out-of-band light when transferring a prescribed pattern onto a wafer by exposure using EUV light in the manufacturing process of a semiconductor device. In addition, an object of the present invention is to provide a reflective mask blank able to be used to fabricate a reflective mask capable of reducing out-of-band light. In addition, an object of the present invention is to provide a substrate with multilayer reflective film and mask blank substrate able to be used to fabricate a reflective mask capable of reducing out-of-band light.

Means for Solving the Problems

The present invention employs the following configurations to solve the aforementioned problems.

(Configuration 1)

A mask blank substrate provided with a base film on a substrate, wherein the base film is formed with a material having a refractive index smaller than the substrate over a wavelength range of not less than 190 nm to not more than 280 nm, and reflectance of the base film arranged on the surface of the substrate is smaller than the reflectance of the substrate over a wavelength range of not less than 190 nm to not more than 280 nm.

Use of the mask blank substrate of Configuration 1 of the present invention enables the fabrication of a reflective mask capable of reducing out-of-band light when transferring a prescribed pattern onto a wafer by exposure using EUV light.

(Configuration 2)

Configuration 2 of the present invention is the mask blank substrate described in Configuration 1, wherein the reflectance of the base film arranged on the surface of the substrate is not more than 5%.

According to Configuration 2 of the present invention, as a result of the reflectance of the base film arranged on the surface of the substrate being not more than 5%, out-of-band light reflected on the surface of the base film can be reduced when transferring a prescribed pattern onto a wafer by exposure using EUV light in a reflective mask fabricated using that substrate.

(Configuration 3)

Configuration 3 of the present invention is the mask blank substrate described in Configuration 1 or Configuration 2, wherein the refractive index of the base film is less than 1.6.

According to Configuration 3 of the present invention, by making the refractive index of the base film to be within a prescribed range, out-of-band light reflected on the surface of the base film can be reliably reduced.

(Configuration 4)

Configuration 4 of the present invention is the mask blank substrate described in any of Configurations 1 to 3, wherein the base film is composed of a material containing a silicon compound.

According to Configuration 4 of the present invention, as a result of the base film being composed of a material containing a silicon compound, a base film can be obtained having a refractive index smaller than that of the substrate over a wavelength range of not less than 190 nm to not more than 280 nm. As a result, out-of-band light reflected on the surface of the base film can be reliably reduced.

(Configuration 5)

Configuration 5 of the present invention is the mask blank substrate described in any of Configurations 1 to 4, wherein the film thickness of the base film is 6 nm to 65 nm.

According to Configuration 5 of the present invention, by making the film thickness of the base film to be within a prescribed range, a base film having the effect of reducing out-of-band light can be reliably formed economically.

(Configuration 6)

Configuration 6 of the present invention is the mask blank substrate described in any of Configurations 1 to 5, comprising a back side conductive film formed on the opposite side of the side having the base film provided thereon and an intermediate film provided between the substrate and the back side conductive film, wherein the reflectance of the base film arranged on the surface of the substrate over a wavelength range of more than 280 nm to not more than 320 nm is not more than 10%.

According to Configuration 6 of the present invention, as a result of the mask blank substrate of the present invention having an intermediate film provided between the substrate and back side conductive film, a reflective mask can be obtained that is able to reduce out-of-band light reflected from the back side of the substrate when transferring a prescribed pattern onto wafer by exposure using EUV light in the manufacturing process of a semiconductor device.

(Configuration 7)

Configuration 7 of the present invention is the mask blank substrate described in Configuration 6, wherein the reflectance of the base film arranged on the surface of the substrate over a wavelength range of more than 280 nm to not more than 400 nm is not more than 15%.

As a result of using the mask blank substrate of Configuration 7 of the present invention, a reflective mask can be fabricated that is able to reduce out-of-band light not only over a range of more than 280 nm to not more than 320 nm, but also over a wavelength range of more than 280 nm to not more than 400 nm.

(Configuration 8)

Configuration 8 of the present invention is the mask blank substrate described in Configuration 6 or 7, wherein the intermediate film is composed of a material containing tantalum, boron and oxygen.

According to Configuration 8 of the present invention, an intermediate film having the effect of reducing out-of-band light can be formed comparatively easily as a result of the intermediate film of the mask blank substrate of the present invention being composed of a material containing tantalum, boron and oxygen.

(Configuration 9)

Configuration 9 of the present invention is the mask blank substrate described in any of Configurations 6 to 8, wherein the film thickness of the intermediate film is 2 nm to 40 nm.

According to Configuration 9 of the present invention, an intermediate film having the effect of reducing out-of-band light can be reliably fabricated economically by making the film thickness of the intermediate film to be within a prescribed range.

(Configuration 10)

Configuration 10 of the present invention is a substrate with multilayer reflective film comprising a multilayer reflective film that reflects exposure light on the base film in the mask blank substrate described in any of Configurations 1 to 9.

Use of the substrate with multilayer reflective film of Configuration 10 of the present invention makes it possible to fabricate a reflective mask capable of reducing out-of-band light.

(Configuration 11)

Configuration 11 of the present invention is the substrate with multilayer reflective film described in Configuration 10, comprising a protective film on the multilayer reflective film.

According to Configuration 11 of the present invention, as a result of forming a protective film on the multilayer reflective film, damage to the surface of the multilayer reflective film can be inhibited when fabricating a reflective mask using the substrate with multilayer reflective film, thereby resulting in favorable reflectance properties with respect to EUV light.

(Configuration 12)

Configuration 12 of the present invention is a reflective mask blank comprising an absorber film on the multilayer reflective film of the substrate with multilayer reflective film described in Configuration 10 or on the protective film of the substrate with multilayer reflective film described in Configuration 11.

Use of the reflective mask blank of Configuration 12 of the present invention makes it possible to fabricate a reflective mask capable of reducing out-of-band light.

(Configuration 13)

Configuration 13 of the present invention is a reflective mask comprising an absorber pattern on the multilayer reflective film that is obtained by patterning the absorber film of the reflective mask blank described in Configuration 12.

Use of the reflective mask blank of Configuration 13 of the present invention makes it possible to reduce out-of-band light of pattern transfer when transferring a prescribed pattern onto a wafer by exposure using EUV light in the manufacturing process of a semiconductor device.

(Configuration 14)

Configuration 14 of the present invention is the reflective mask described in Configuration 13 comprising a light shielding band, from which the absorber film and the multilayer reflective film are removed, outside a transfer pattern region where the absorber pattern is formed.

According to Configuration 14 of the present invention, out-of-band light attributable to reflection from the light shielding band of a reflective mask can be reduced when transferring a prescribed pattern onto a wafer by exposure using EUV light.

(Configuration 15)

Configuration 15 of the present invention is a method for manufacturing a semiconductor device comprising a step for carrying out a lithographic process using an exposure apparatus using the reflective mask described in Configuration 13 or Configuration 14 to form a transfer pattern on a transferred substrate.

According to the method for manufacturing a semiconductor device of Configuration 15 of the present invention, a semiconductor device having a fine and highly precise transfer pattern can be manufactured since out-of-band light can be reduced during pattern transfer.

Effects of the Invention

According to the present invention, a reflective mask can be provided that is able to reduce out-of-band light when transferring a prescribed pattern onto a wafer by exposure using EUV light in the manufacturing process of a semiconductor device. In addition, according to the present invention, a reflective mask blank can be provided that can be used to fabricate a reflective mask capable of reducing out-of-band light. In addition, according to the present invention, a substrate with multilayer reflective film and mask blank substrate can be provided that can be used to fabricate a reflective mask capable of reducing out-of-band light.

MODE FOR CARRYING OUT THE INVENTION

The following provides a detailed explanation of embodiments of the present invention with reference to the drawings. Furthermore, the following embodiments are intended to serve as aspects for providing a detailed explanation of the present invention, and are not intended to limit the present invention to the scope thereof.

<Mask Blank Substrate 120 and Reflective Mask Blank 100>

Figure 1:
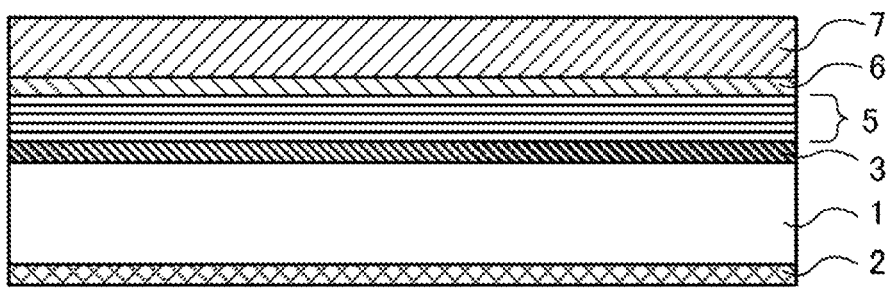
FIG. 1 is a cross-sectional schematic diagram of the reflective mask blank of the present invention.

FIG. 1 is a cross-sectional schematic diagram of an example of a first reflective mask blank 100 for EUV lithography of the present invention. The reflective mask blank 100 shown in FIG. 1 has a substrate 1, a prescribed base film 3 formed on the side of a first main surface (top side) of the substrate 1, a multilayer reflective film 5 that reflects exposure light in the form of EUV light, a protective film 6 for protecting the multilayer reflective film 5, and an absorber film 7 that absorbs EUV light, laminated in that order. In addition, a back side conductive film 2 for electrostatic chucking is formed on a second main surface (back side) of the substrate 1 of the reflective mask blank 100 shown in FIG. 1.

Figure 2:
FIG. 2 is a cross-sectional schematic diagram of a mask blank substrate for use in fabricating the reflective mask blank shown in FIG. 1.

FIG. 2 depicts a cross-sectional schematic diagram of an example of a mask blank substrate 120 of the present invention. The mask blank substrate 120 shown in FIG. 2 can be used to fabricate the reflective mask blank 100 shown in FIG. 1. The mask blank substrate 120 shown in FIG. 2 is provided with a prescribed base film 3 on the surface of the substrate 1, preferably in contact with the surface of the substrate 1.

The base film 3 of the mask blank substrate 120 shown in FIG. 2 is a thin film having a refractive index small than that of the substrate 1 over a wavelength range of not less than 190 nm to not more than 280 nm. In addition, the prescribed base film 3 arranged on the surface of the substrate 1 is formed with a material having reflectance over a wavelength range of not less than 190 nm to not more than 280 mm that is smaller than the reflectance of the substrate 1. As a result of the mask blank substrate 120 and the reflective mask blank 100 of the present invention having the prescribed base film 3, a reflective mask 200 can be fabricated that is capable of reducing out-of-band light over a wavelength range of not less than 190 nm to not more than 280 nm.

Figure 3:
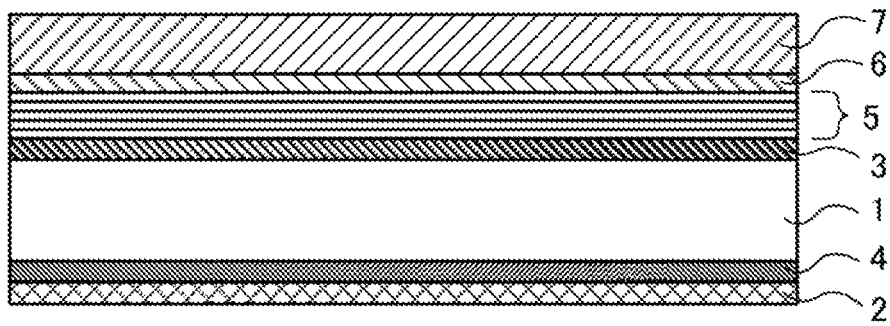
FIG. 3 is a cross-sectional schematic diagram of a different aspect of the reflective mask blank of the present invention.

FIG. 3 is a cross-sectional schematic diagram of a second reflective mask blank 100 of the present invention. The reflective mask blank 100 shown in FIG. 3 has a substrate 1, a prescribed base film 3 formed on the side of the first main surface (top side) of the substrate 1, a multilayer reflective film 5 that reflects exposure light in the form of EUV light, a protective film 6 for protecting the multilayer reflective film 5, and an absorber film 7 that absorbs EUV light, laminated in that order. In addition, a prescribed intermediate film 4 and a back side conductive film 2 for electrostatic chucking are formed on the second main surface (back side) of the substrate 1 of the reflective mask blank shown in FIG. 3. The prescribed intermediate film 4 is preferably formed so as to contact the substrate 1, and the back side conductive film 2 is preferably formed to contact the prescribed intermediate film 4.

Figure 4:
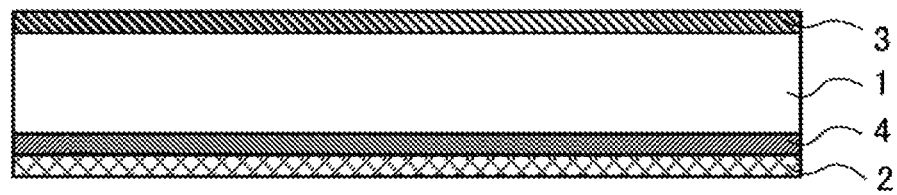
FIG. 4 is a cross-sectional schematic diagram of a mask blank substrate for use in fabricating the reflective mask blank shown in FIG. 3.

FIG. 4 depicts a cross-sectional schematic diagram of one example of the mask blank substrate 120 of the present invention. The mask blank substrate 120 shown in FIG. 4 can be used to fabricate the reflective mask blank 100 shown in FIG. 3. The mask blank substrate 120 shown in FIG. 4 has the back side conductive film 2 on the surface on the opposite side from the surface provided with the base film 3 and the prescribed intermediate film 4 formed between the substrate 1 and the back side conductive film 2. The prescribed intermediate film 4 is preferably formed to contact the substrate 1, and the back side conductive film 2 is preferably formed to contact the prescribed intermediate film 4.

The prescribed intermediate film 4 is a thin film in which the reflectance thereof over a wavelength range of more than 280 nm to not more than 320 nm is not more than 10% when reflectance of the base film arranged on the surface of the opposite side of the substrate 1 is measured. As a result of the mask blank substrate 120 and the reflective mask blank 100 of the present invention having the intermediate film 4 provided between the substrate 1 and the back side conductive film 2, the reflective mask blank 200 can be obtained that is capable of reducing out-of-band light over a range of more than 280 nm to not more than 320 nm caused by reflection from the back side of the substrate 1 when transferring a prescribed pattern onto a wafer by exposure using EUV light in the manufacturing process of a semiconductor device.

Figure 5:
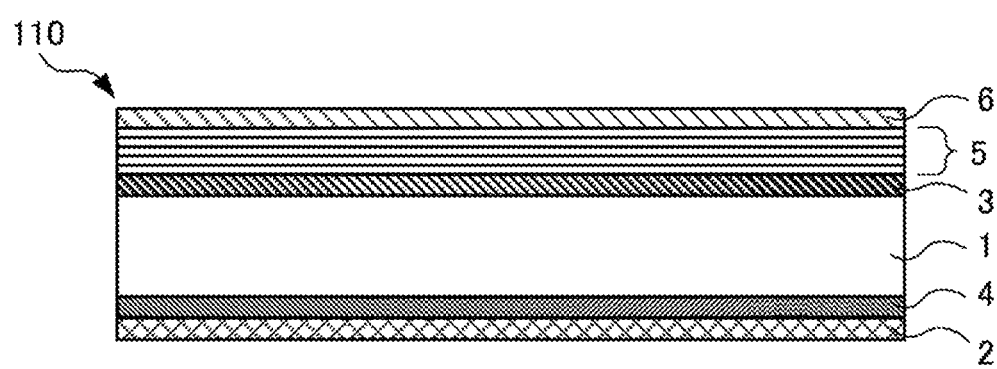
FIG. 5 is a cross-sectional schematic diagram of a substrate with multilayer reflective film for use in fabricating the reflective mask blank shown in FIG. 1.

In the present description, the "mask blank substrate 120" includes the substrate alone (substrate 1) as well as that in which a thin film other than the multilayer reflective film 5, such as the base film 3, the intermediate film 4 or the back side conductive film 2, is formed on the substrate 1. In addition, in the present description, the "substrate with multilayer reflective film 110" refers to that in which the multilayer reflective film 5 is formed on the mask blank substrate 120. FIG. 5 depicts an example of a cross-sectional schematic diagram of the substrate with multilayer reflective film 110. Furthermore, the "substrate with multilayer reflective film 110" includes that having a thin film other than the absorber film 7, such as the protective film 6, formed thereon. In the present description, the "reflective mask blank 100" refers to that having the absorber film 7 formed on the substrate with multilayer reflective film 110. Furthermore, the "reflective mask blank 100" includes that having an additional thin film, such as an etching mask film or resist film, formed thereon.

The present invention includes a prescribed substrate with multilayer reflective film 110 having the multilayer reflective film 5 that reflects exposure light on the base film 3 in the prescribed mask blank substrate 120. Use of the substrate with multilayer reflective film 110 of the present invention makes it possible to fabricate the reflective mask 200 that is capable of reducing out-of-band light.

The present invention includes a prescribed reflective mask blank 100 having the absorber film 7 on the prescribed substrate with multilayer reflective film 110. More specifically, the reflective mask blank 100 of the present invention has the absorber film 7 on the multilayer reflective film 5 of the prescribed substrate with multilayer reflective film 110 or on the protective film 6 of the prescribed substrate with multilayer reflective film 110. Use of the reflective mask blank 100 of the present invention makes it possible to fabricate the reflective mask 200 that is capable of reducing out-of-band light.

In the present description, "arranging (forming) the absorber film 7 on the multilayer reflective film 5" includes not only the case of being arranged on the multilayer reflective film 5 in contact with the surface thereof, as well as the case of having another film between the multilayer reflective film 5 and the absorber film 7. This applies similarly to other films as well. In addition, in the present description, "arranging a film A on the surface of a film B in contact with the surface thereof" refers to the film A and the film B being arranged so as to be in direct contact without having another film interposed there between.

In the present description, out-of-band light refers to vacuum ultraviolet light and ultraviolet light over a prescribed wavelength range that are generated in the case of using EUV light as exposure light from the light source of an exposure apparatus. The prescribed wavelength range can refer to wavelengths of not less than 190 nm to not more than 400 nm. In particular, according to the present invention, the effect of reducing out-of-band light can be demonstrated with respect to out-of-band light over a wavelength range of not less than 190 nm to not more than 280 nm, out-of-band light over a wavelength range of more than 280 nm to not more than 320 nm, and out-of-band light over a wavelength range of more than 280 nm to not more than 400 nm.

The following provides an explanation of each thin film and the like contained in the mask blank substrate 120 and the reflective mask blank 100.

<<Substrate 1>>

The substrate 1 of the mask blank substrate 120 and reflective mask blank 100 of the present invention is required to prevent the occurrence of absorber pattern distortion caused by heat during EUV exposure. Consequently, a substrate is preferably used for the substrate 1 that has a low coefficient of thermal expansion within the range of 0±5 ppb/° C. Examples of materials having a low coefficient of thermal expansion within this range that can be used include $SiO_2$—$TiO_2$-based glass and multicomponent glass ceramics.

The first main surface on the side of the substrate 1 on which a transfer pattern (composed of the absorber film 7 to be subsequently described) is formed is subjected to surface processing so as to have a prescribed flatness at least from the viewpoints of pattern transfer accuracy and positional accuracy. In the case of EUV exposure, flatness in a region measuring 132 mm×132 mm on a main surface of the substrate 1 on the side on which a transfer pattern is formed is preferably not more than 0.1 μm, more preferably not more than 0.05 μm, and even more preferably not more than 0.03 μm. In addition, a second main surface on the opposite side from the side on which the absorber film 7 is formed is the surface that is electrostatically chucked when placed in an exposure apparatus. The flatness of the second main surface in a region measuring 132 mm×132 mm is preferably not more than 0.1 μm, more preferably not more than 0.05 μm, and even more preferably not more than 0.03 μm. Furthermore, the flatness in a region measuring 142 mm×142 mm is preferably not more than 1 μm, more preferably not more than 0.5 μm and even more preferably not more than 0.3 μm.

In addition, the height of surface smoothness of the substrate 1 is also an extremely important parameter. Surface roughness in terms of the root mean square roughness (Rms) of the first main surface on which the absorber pattern for transfer is formed is preferably not more than 0.15 nm and more preferably not more than 0.10 nm. Furthermore, surface smoothness can be measured with an atomic force microscope.

Moreover, the substrate 1 preferably has high rigidity in order to prevent deformation of a film (such as the multilayer reflective film 5) formed on the substrate 1 caused by film stress. In particular, the substrate 1 preferably has a high Young's modulus of not less than 65 GPa.

<<Base Film 3>>

The present invention is the mask blank substrate 120 provided with the base film 3 on the substrate 1. The base film 3 is a thin film formed between the substrate 1 and the multilayer reflective film 5.

The base film 3 is formed with a material having a smaller refractive index than that of the substrate 1 within a wavelength range of not less than 190 nm to not more than 280 nm. In this case, the reflectance of the base film 3 arranged on the surface of the substrate 1 becomes smaller than the reflectance of the substrate 1 over a wavelength range of not less than 190 nm to not more than 280 nm. The use of the mask blank substrate 120 provided with the base film 3 having such properties makes it possible to fabricate the reflective mask 200 capable of reducing out-of-band light.

The reflectance of the base film 3 of the mask blank substrate 120 of the present invention is preferably not more than 5%. As a result of the reflectance of the base film 3 being not more than 5%, out-of-band light reflected at the surface of the base film 3 can be reduced in the reflective mask blank 200 fabricated using the mask blank substrate 120 of the present invention.

The refractive index of the base film 3 of the mask blank substrate 120 of the present invention is preferably less than 1.6. As a result of the refractive index of the base film 3 being within a prescribed range, out-of-band light reflected at the surface of the base film 3 can be reliably reduced. Furthermore, since the refractive index of air is roughly 1, the refractive index of the base film 3 is naturally greater than 1. As a result of making the refractive index of the base film 3 to be between the refractive index of the substrate 1 and the refractive index of air, out-of-band light reflected at the surface of the base film 3 can be reliably reduced.

The material of the base film 3 preferably contains a silicon compound. Specific examples of silicon compounds include $SiO_2$ and $SiO_x$. The refractive index of $SiO_2$—$TiO_2$ substrates typically used as substrates of reflective masks over a wavelength range of 190 nm to 400 nm is about 1.45 to 1.65. On the other hand, since the refractive index of $SiO_2$ over the aforementioned wavelength range is 1.48 to 1.57, the refractive index of the base film 3 composed of $SiO_2$ can be made to be between the refractive index of the substrate 1 and the refractive index of air. In addition, the refractive index of the base film 3 composed of $SiO_x$ can be made to be between the refractive index of the substrate 1 and the refractive index of air by adjusting the oxygen content x of $SiO_x$. Thus, as a result of forming the base film 3 from a silicon compound such as $SiO_2$ or $SiO_x$, the base film 3 can be obtained having a refractive index smaller than that of the substrate 1 within the aforementioned prescribed wavelength range. As a result, out-of-band light reflected at the surface of the base film 3 can be reliably reduced.

Furthermore, in addition to silicon compounds, a material having a refractive index between the refractive index of the substrate 1 and the refractive index of air can also be used for the material of the base film 3. Examples of such materials include $CaF_2$ (1.45 to 1.50), LiF (1.41 to 1.45), $MgF_2$ (1.39 to 1.43) and NaF (1.34 to 1.39). Furthermore, the numerical range indicated in parentheses indicates the refractive index over a wavelength range of 190 nm to 320 nm.

The film thickness of the base film 3 in the mask blank substrate of the present invention is preferably 6 nm to 65 nm. In addition, the film thickness of the base film 3 is more preferably not more than 45 nm and even more preferably not more than 25 nm. In the case the film thickness of the base film 3 is less than 6 nm, the film becomes excessively thin thereby preventing the function of the base film 3 from being demonstrated. In addition, in the case the film thickness of the base film 3 is more than 65 nm, an excessive amount of time is required to form the base film 3, thereby making this uneconomical. Thus, by making the film thickness of the base film 3 to be within the aforementioned prescribed range, the base film 3 having the effect of reducing out-of-band light can be formed reliably and economically.

A sputtering method is used to form the base film 3. Furthermore, the base film 3 having $SiO_2$ or $SiO_x$ as a material thereof can be formed by sputtering in an Ar gas atmosphere using an $SiO_2$ target or by reactive sputtering in a mixed gas atmosphere of $O_2$ and Ar using an Si target. Moreover, injecting sputtered particles of materials composing the base film 3 at an angle of not more than 45 degrees relative to the normal of the main surface of the substrate 1 is more preferable for further improving surface smoothness.

<<Multilayer Reflective Film 5>>

The multilayer reflective film 5 is imparted with the function of reflecting EUV light in the reflective mask 200. The multilayer reflective film 5 is a multilayer film obtained by cyclically laminating each layer having an element having a different refractive index as the main component thereof.

In general, a laminated film obtained by alternately laminating a thin film of a high refractive index material in the form of a light element or compound thereof (high refractive index layer) and a thin film of a low refractive index material in the form of a heavy element or compound thereof (low refractive index layer) for 40 to 60 cycles is used for the multilayer reflective film.

The multilayer film used for the multilayer reflective film 5 may be obtained by laminating a high refractive index layer/low refractive index layer laminated structure, obtained by laminating a high refractive index layer and low refractive index layer in that order starting from the side of the substrate 1 (base film 3), for a plurality of cycles, with the lamination of this laminated structure comprising one cycle. In addition, the multilayer layer film used for the multilayer reflective film 5 may be obtained by laminating a low refractive index layer/high refractive index layer laminated structure, obtained by laminating a low refractive index layer and a high refractive index layer in that order starting from the side of the substrate 1, for a plurality of cycles, with the lamination of this laminated structure comprising one cycle. Furthermore, the uppermost layer of the multilayer reflective film 5, namely the surface layer of the multilayer reflective film 5 on the opposite side from the side of the substrate 1, is preferably a high refractive index layer. In the aforementioned laminated film, in the case of laminating a high refractive index layer/low refractive index layer laminated structure, obtained by laminating a high refractive index layer and a low refractive index layer in that order starting from the side of the base film 3, for a plurality of cycles, with the lamination of this laminated structure comprising one cycle, the uppermost layer is the low refractive index layer. In this case, since the low refractive index layer ends up being oxidized easily if the low refractive index layer composes the uppermost layer of the multilayer reflective film 5, the reflectance of the reflective mask 200 decreases. Consequently, a multilayer reflective film 5 in which a high refractive index layer is further formed on the low refractive index layer of the uppermost layer is preferable. On the other hand, in the aforementioned multilayer film, in the case of laminating a low refractive index layer/high refractive index layer laminated structure, obtained by laminating a low refractive index layer and a high refractive index layer in that order starting from the side of the substrate 1, for a plurality of cycles, with the lamination of this laminated structure comprising one cycle, the uppermost layer is the high refractive index layer. Thus, in this case, it is not necessary to further form a high refractive index layer.

In the present embodiment, a layer containing silicon (Si) is employed as a high refractive index layer. Examples of materials containing Si that can be used include Si alone as well as Si compounds containing boron (B), carbon (C), nitrogen (N) and/or oxygen (O) in addition to Si. Use of a high refractive index layer containing Si allows the obtaining of the reflective mask 200 having superior reflectance of EUV light. In addition, a metal selected from the group consisting of molybdenum (Mo), ruthenium (Ru), rhodium (Rh) and platinum (Pt), or an alloy thereof, can be used as a low refractive index layer. For example, an Mo/Si cyclically laminated film, obtained by alternatively laminating an Mo film and Si film for about 40 to 60 cycles, is preferably used for the multilayer reflective film 5 for reflecting EUV light having a wavelength of 13 nm to 14 nm. Furthermore, the uppermost layer in the form of a high refractive index layer of the multilayer reflective film 5 can be formed with silicon (Si), and a silicon oxide layer containing silicon and oxygen can be formed between the uppermost layer (Si) and the protective film 6. Mask cleaning resistance can be improved in the case of this structure.

The reflectance of the multilayer reflective film 5 alone is normally not less than 65%, and the upper limit thereof is normally 73%. Furthermore, the film thickness and cycle of each constituent layer of the multilayer reflective film 5 can be suitably selected according to the exposure wavelength. More specifically, the film thickness and cycle of each constituent layer of the multilayer reflective film 5 can be selected so as to satisfy Bragg's law of reflection. In the multilayer reflective film 5, a plurality of high refractive index layers and low refractive index layers are respectively present. In this case, the film thickness of high refractive index layers and the film thickness of low refractive index layers are not necessarily required to be the same. In addition, the film thickness of the Si layer of the uppermost surface of the multilayer reflective film 5 can be adjusted within a range that does not cause a decrease in reflectance. The film thickness of the uppermost Si layer (high refractive index layer) can be from 3 nm to 10 nm.

A method known in the art can be used to form the multilayer reflective film 5. Each layer of the multilayer reflective film 5 can be formed by depositing by, for example, ion beam sputtering. In the case of the aforementioned Mo/Si cyclic multilayer film, a Si film having a film thickness of about 4 nm is first deposited on the base film 3 using a Si target by, for example, ion beam sputtering. Subsequently, a Mo film having a film thickness of about 3 nm is deposited using a Mo target. When the deposition of this Si film and Mo film is defined as one cycle, the multilayer reflective film 5 is formed by laminating for 40 to 60 cycles (with the layer of the uppermost surface being a Si layer).

Deposition of the base film 3 and the multilayer reflective film 5 is preferably carried continuously in a vacuum. Contaminant defect rate increases if a step in which the system is opened to the atmosphere and a step during which a vacuum is drawn are carried out. On the other hand, contaminant defects can be reduced by depositing continuously in a vacuum. Furthermore, in consideration of efficient operation of equipment, following deposition of the base film 3, the system can be temporarily exposed to the atmosphere followed by depositing the multilayer reflective film 5 with another apparatus.

<<Protective Film 6>>

The substrate with multilayer reflective film 110 of the present invention preferably has the protective film 6 on the multilayer reflective film 5. As a result of the protective film 6 being formed on the multilayer reflective film 5, damage to the multilayer reflective film 5 can be inhibited when fabricating the reflective mask 200 using the substrate with multilayer reflective film 110. Consequently, reflectance properties of the resulting reflective mask 200 with respect to EUV light are favorable.

The protective film 6 is formed on the multilayer reflective film 5 in order to protect the multilayer reflective film 5 from dry etching and cleaning in the fabrication process of the reflective mask 200 to be subsequently described. In addition, the protective film 6 is also imparted with the function of protecting the reflective film 5 during opaque defect correction of the mask pattern using an electron beam (EB). Here, FIGS. 1 and 3 indicate the case of the protective film 6 consisting of a single layer. However, the protective film 6 can employ a laminated structure of three or more layers wherein the lowermost layer and the uppermost layer consist of, for example, layers composed of a substance containing Ru, and a metal other than Ru or an alloy is interposed between the lowermost layer and the uppermost layer. The protective film 6 is formed from, for example, a material containing ruthenium as a main component thereof. Examples of materials containing ruthenium as a main component thereof include ruthenium metal alone, Ru alloys containing Ru and a metal such as titanium (Ti), niobium (Nb), molybdenum (Mo), zirconium (Zr), yttrium (Y), boron (B), lanthanum (La), cobalt (Co) and/or rhenium (Re), and materials containing nitrogen in the aforementioned materials. Among these, the protective film 6 composed of a Ru-based material containing Ti is used particularly preferably. In this case, the phenomenon by which a constituent element of the multilayer reflective film 5 in the form of silicon diffuses from the surface of the multilayer reflective film 5 to the protective film 6 can be inhibited. Consequently, surface roughening during mask cleaning decreases and there is less susceptibility to peeling. Since a decrease in surface roughening is directly linked to prevention of a decrease in reflectance of the multilayer reflective film 5 with respect to EUV light, this is important in terms of improving exposure efficiency of EUV exposure as well as improving throughput.

The Ru content ratio of the Ru alloy used in the protective film 6 is not less than 50 at % to less than 100 at %, preferably not less than 80 at % to less than 100 at %, and more preferably not less than 95 at % to less than 100 at %. In the case the Ru content ratio of the Ru alloy is not less than 95 at % to less than 100 at % in particular, diffusion of the constituent element (silicon) of the multilayer reflective film 5 to the protective film 6 can be inhibited. In addition, the protective film 6 in this case can also be provided with resistance to mask cleaning, an etching stopper function during etching processing of the absorber film 7, and a function that prevents time-based changes in the multilayer reflective film 5 while adequately ensuring reflectance of EUV light.

In the case of EUV lithography, EUV pellicles that prevent adherence of contaminants to the mask pattern present technical difficulties since there are few substances that are transparent with respect to exposure light. On the basis thereof, pellicle-less operation, in which pellicles are not used, is currently the mainstream. In addition, in EUV lithography, exposure contamination occurs in which carbon accumulates on the mask or there is growth of an oxide film caused by EUV exposure. Consequently, it is necessary to repeatedly carry out cleaning to remove foreign objects and contaminants present on the mask at the stage the mask is used in the manufacturing of a semiconductor device. Thus, the EUV reflective mask 200 is required to demonstrate a much higher level of mask cleaning resistance in comparison with light-transmitting masks for photolithography. Use of the protective film 6 composed of an Ru-based material containing Ti results in the demonstration of a high level of cleaning resistance particularly with respect to cleaning solutions such as sulfuric acid, sulfuric acid/hydrogen peroxide mixture (SPM), ammonia, ammonia/hydrogen peroxide mixture (APM) or OH radial cleaning solution, and cleaning solutions such as ozone water having a concentration of not more than 10 ppm, thereby making it possible to satisfy requirements regarding mask cleaning resistance.

There are no particular limitations on the film thickness of the protective film 6 provided it allows the function as the protective film 6 to be demonstrated. From the viewpoint of reflectance of EUV light, the film thickness of the protective film 6 is preferably 1.0 nm to 8.0 nm and more preferably 1.5 nm to 6.0 nm.

A known film formation method can be employed without limitation for the method for forming the protective film 6. Specific examples of the method used to form the protective film 6 include sputtering and ion beam sputtering.

The protective film 6 is preferably subjected to heat treatment (annealing) at a temperature of not lower than 100° C. to not higher than 300° C., preferably not lower than 120° C. to not higher than 250° C., and more preferably not lower than 150° C. to not higher than 200° C. while formed on the multilayer reflective film 5. In addition to making it possible to prevent decreases in flatness caused by mask blank stress and strain by reducing stress, this annealing also makes it possible to prevent time-based changes in EUV light reflectance of the multilayer reflective film 5. In particular, in the case the protective film 6 is composed of a RuTi alloy containing Ti, diffusion of Si from the multilayer reflective film 5 can be effectively inhibited by this annealing, thereby making it possible to prevent decreases in reflectance of EUV light.

<<Absorber Film 7>>

The absorber film 7 is formed on the multilayer reflective film 5 (or on the protective film 6 in the case the protective film 6 is formed thereon). The basic function of the absorber film 7 is to absorb EUV light. The absorber film 7 may be the absorber film 7 used for the purpose of absorbing EUV light or may the absorber film 7 having a phase shift function in consideration of a phase shift difference of the EUV light. The absorber film 7 having a phase shift function generates a phase shift by absorbing EUV light in addition to reflecting a portion thereof. Namely, in the area where the absorber film 7 is formed in a reflective mask blank 200 patterned with the absorber film 7 having a phase shift function, EUV light is absorbed and attenuated while a portion of the light is reflected to a degree that does not have a detrimental effect on pattern transfer. In addition, in the region (field) where the absorber film 7 is not formed, EUV light is reflected from the multilayer reflective film 5 through the protective film 6. Consequently, the absorber film 7 has a desired phase difference that is intermediate to reflected light from the absorber film 7 having a phase shift function and reflected light from the field. The absorber film 7 having a phase shift function is formed so that the phase difference between reflected light from the absorber film 7 and reflected light from the multilayer reflective film 5 is from 170 degrees to 190 degrees. The image contrast of projected optical images is improved by mutual interference of light having a phase difference inverted in the vicinity of 180 degrees. Accompanying this improvement of image contrast, resolution increases and various tolerances relating to exposure, such as exposure tolerance or focus tolerance, can be increased.

The absorber film 7 may be a single-layer film or a multilayer film composed of a plurality of films (such as a lower layer absorber film 71 and an upper layer absorber film 72). The case of a single-layer film is characterized by improved production efficiency as a result of being able to decrease the number of steps during mask blank fabrication. In the case of a multilayer film, the upper layer absorber film 72 can be provided with a suitable optical constant and film thickness so as to serve as an anti-reflective film when inspecting the mask pattern using light. As a result, inspection sensitivity is improved when inspecting the mask pattern using light. In addition, if a film is used in which oxygen (O) and nitrogen (N) have been added to the upper layer absorber film 72 to improve oxidation resistance, stability over time improves. In this manner, various functions can be added by using a multilayer film for the absorber film 7. In the case the absorber layer 7 is the absorber layer 7 having a phase shift function, a desired reflectance can be easily obtained since the range over which optical adjustments can be made by incorporating multiple layers can be increased.

There are no particular limitations on the material of the absorber film 7 provided it has the function of absorbing EUV light and can be processed by etching (and preferably etched by dry-etching with chlorine (Cl) or fluorine (F)). Examples of materials having such functions that can be used preferably include tantalum (Ta) alone and tantalum compounds containing Ta as a main component thereof.

The absorber film 7 composed of the aforementioned tantalum or tantalum compound can be formed by DC sputtering or magnetron sputtering such as RF sputtering. For example, the absorber film 7 can be deposited by reactive sputtering using a target containing tantalum and boron and using argon gas containing oxygen or nitrogen.

The tantalum compound used to form the absorber film 7 contains a Ta alloy. In the case the absorber film 7 consists of a Ta alloy, the crystalline state of the absorber 7 is preferably that of an amorphous or microcrystalline structure from the viewpoint of smoothness and flatness. If the surface of the absorber film 7 is not smooth and flat, edge roughness of absorber patterns 7a and 7b increases resulting in poor pattern dimensional accuracy. The surface roughness of the absorber film 7 in terms of root mean square roughness (Rms) is preferably not more than 0.5 nm, more preferably not more than 0.4 nm, and even more preferably not more than 0.3 nm.

Examples of tantalum compounds that can be used to form the absorber film 7 include compounds containing Ta and B, compounds containing Ta and N, compounds containing Ta, O and N, compounds containing Ta and B and at least either O or N, compounds containing Ta and Si, compounds containing Ta, Si and N, compounds containing Ta and Ge, and compounds containing Ta, Ge and N.

Ta is a material that has a large absorption coefficient and can be easily dry-etched with a chlorine-based and/or fluorine-based gas. Consequently, Ta can be said to be a material of the absorber film 7 that has superior processability. Moreover, the addition of B, Si and/or Ge to Ta allows an amorphous material to be easily obtained. As a result, the smoothness of the absorber film 7 can be improved. In addition, since the addition of N and/or O to Ta improves resistance to oxidation of the absorber film 7, the effect is obtained of being able to improve stability over time.

By making the absorber film 7 to be in the form of a laminated film composed of the TaBN lower layer absorber film 71 and the TaBO upper layer absorber film 72 and making the film thickness of the TaBO of the upper layer absorber film 72 to be about 14 nm, this upper layer absorber film 72 becomes an anti-reflective film during mask pattern defect inspections using light. Consequently, inspection sensitivity can be improved when inspecting mask pattern defects.

In addition, other examples of materials that compose the absorber film 7 in addition to tantalum and tantalum compounds include chromium and chromium compounds such as Cr, CrN, CrCON, CrCO, CrCOH or CrCONH, as well as WN, TiN and Ti.

<<Intermediate Film 4>>

As shown in FIG. 3, the mask blank substrate 120 of the present invention has a prescribed intermediate film 4 formed between the substrate 1 and the back side conductive film 2 on the surface (main surface) of the substrate 1 on the opposite side from the side provided with the base film 3.

In the case the mask blank substrate 120 of the present invention has the intermediate film 4 formed on the side opposite from the side provided with the base film 3 and further has the back side conductive film 2 formed therein, reflectance at the surface of base film 3 arranged on the surface of the substrate 1 over a wavelength range of more than 280 nm to not more than 320 nm is preferably not less than 10%.

The back side conductive film 2 for electrostatic chucking is required to be formed on the second main surface of the substrate 1 (side opposite from the side on which the multilayer reflective film 5 is formed). However, due to the presence of the back side conductive film 2 on the back side of the reflective mask 200, out-of-band light contained in EUV light is reflected by the back side conductive film 2 during exposure using EUV light, thereby having an effect on pattern transfer. As a result of the reflective mask 200 having the prescribed intermediate film formed between the substrate 1 and the back side conductive film 2, reflection of out-of-band light, and particularly reflection of out-of-band light over a wavelength range of more than 280 nm to not more than 320 nm (or over a wavelength range of more than 280 nm to not more than 400 nm depending on the case), can be reduced. Namely, out-of-band light over a wavelength range of more than 280 nm to not more than 320 nm (or over a wavelength range of more than 280 nm to not more than 400 nm depending on the case) reflected by the back side conductive film 2 after passing through the substrate 1 can be inhibited due to interference between reflected light at the interface of the substrate 1 and the back side conductive film 2 and reflected light at the interface of the intermediate film 4 and the back side conductive film 2. Consequently, out-of-band light over a wavelength range of more than 280 nm to not more than 320 nm (or over a wavelength range of more than 280 nm to not more than 400 nm depending on the case) can be reduced.

More specifically, by suitably selecting the prescribed intermediate film 4, reflectance over a wavelength range of more than 280 nm to not more than 320 nm at the surface of the base film 3 arranged on the surface of the substrate 1 can be made to be not more than 10%. Furthermore, out-of-band light over a wavelength range of not less than 190 nm to not more than 280 nm can be reduced since it is attenuated when transmitted through the base film 3. As was previously described, as a result of the mask blank substrate 120 of the present invention having the intermediate film 4 provided between the substrate 1 and the back side conductive film 2, the reflective mask 200 can be obtained that is capable of reducing out-of-band light caused by reflection from the back side of the substrate 1 when transferring a prescribed pattern onto a wafer by exposure using EUV light in the manufacturing process of a semiconductor device.

Reflectance over a wavelength range of more than 280 nm to not more than 400 nm of the base film 3 arranged on the surface of the substrate 1 in the mask blank substrate 120 of the present invention is preferably not more than 15%. As a result of the reflective mask 200 having the prescribed intermediate film 4 formed between the substrate 1 and the back side conductive film 2, reflection of exposure light, and particularly reflection of exposure light over a wider range than a wavelength range of more than 280 nm to not more than 320 nm, and particularly exposure light over a wavelength range of more than 280 nm to not more than 400 nm, can be reduced. Consequently, out-of-band light over a wavelength range of more than 280 nm to not more than 400 nm can be reduced.

The intermediate film 4 of the mask blank substrate 120 of the present invention is preferably composed of a material containing tantalum, boron and oxygen (TaBO). The intermediate film 4 having TaBO as a material thereof can be formed by reactive sputtering using a TaB target in a mixed gas atmosphere of Ar gas and $O_2$ gas. In the case the intermediate film 4 is a TaBO film, the intermediate film 4 having the effect of reducing out-of-band light can be formed comparatively easily. Furthermore, the oxygen content in the TaBO film is preferably not less than 50 at % in order to more reliably demonstrate the effect of the intermediate film.

The film thickness of the intermediate film 4 in the mask blank substrate 120 of the present invention is preferably 2 nm to 40 nm and more preferably 18 nm to 35 nm. In the case the film thickness of the intermediate film 4 is less than 2 nm, the intermediate film 4 becomes excessively thin and is unable to function as the intermediate film 4. In addition, in the case the film thickness of the intermediate film 4 is more than 40 nm, an excessive amount of time is required to form the intermediate film 4, thereby making this uneconomical. Thus, by making the film thickness of the intermediate film 4 to be within the aforementioned prescribed range, the intermediate film 4 having the effect of reducing out-of-band light can be reliably formed economically.

<<Back Side Conductive Film 2>>

The back side conductive film 2 for electrostatic chucking is formed on side of the second main surface (back side) of the substrate 1 (opposite side of the side on which the multilayer reflective film 5 is formed and on the intermediate film 4 in the case the intermediate film is formed). The sheet resistance required by the back side conductive film 2 for electrostatic chucking is normally not more than 1000 Ω/square. The method used to form the back side conductive film 2 is, for example, magnetron sputtering or ion beam sputtering using a metal such as chromium or tantalum, or an alloy thereof, as a target. The material containing chromium (Cr) of the back side conductive film 2 is preferably a Cr compound containing Cr and at least one element selected from among boron, nitrogen, oxygen and carbon. Examples of Cr compounds include CrN, CrON, CrCN, CrCON, CrBN, CrBON, CrBCN and CrBOCN. Ta (tantalum), an alloy containing Ta, or a Ta compound containing at least one element from among boron, nitrogen, oxygen and carbon, is preferably used for the material containing tantalum (Ta) of the back side conductive film 2. Examples of Ta compounds include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Although there are no particular limitations on the film thickness of the back side conductive film 2 provided the requirement of functioning as a conductive film for electrostatic chucking is satisfied, it is normally 10 nm to 200 nm. In addition, this back side conductive film 2 is also imparted with the function of adjusting stress on the side of the second main surface of the mask blank 100. Namely, the back side conductive film 2 balances the stress from each type of film formed on the side of the first main surface and adjusts that stress so as to allow the obtaining of a flat reflective mask blank 100.

<<Other Thin Films>>

The reflective mask blank 100 of the present invention can be provided with a hard mask film (also referred to as an "etching mask film") and/or a resist film on the absorber film 7. Examples of typical materials of the etching hard film include silicon (Si) and materials obtained by adding oxygen (O), nitrogen (N), carbon (C) and/or hydrogen (H) to silicon. Specific examples include $SiO_2$, SiON, SiN, SiO, Si, SiC, SiCO, SiCN and SiCON. However, in the case the absorber film 7 is a compound that contains oxygen, it is preferable to avoid the use of a material containing oxygen such as $SiO_2$ for the etching hard mask from the viewpoint of etching resistance. In the case of having formed an etching hard mask, the film thickness of the resist film can be reduced, which is advantageous in terms of pattern miniaturization.

<Reflective Mask 200 and Manufacturing Method Thereof>

The present invention is a reflective mask 200 having an absorber pattern on the multilayer reflective film by patterning the absorber film 7 of the aforementioned reflective mask blank 100. Use of the reflective mask 200 of the present invention makes it possible to reduce out-of-band light of pattern transfer when transferring a prescribed pattern onto a wafer by exposure using EUV light in the manufacturing process of a semiconductor device.

The reflective mask 200 is fabricated using the reflective mask blank 100 of the present embodiment. The following only provides a general explanation, while a detailed explanation is provided in the examples to be subsequently described with reference to the drawings.

The reflective mask blank 100 is prepared, the resist film 8 is formed on the uppermost surface of the first main surface thereof (on the absorber film 7 as will be explained in the following examples) (although not required in the case a resist film is provided in the form of the reflective mask blank 100), and a desired pattern such as a circuit pattern is drawn (exposed) on this resist film 8, followed by developing and rinsing to form a prescribed resist pattern 8a.

An absorber pattern 7a is then formed by dry-etching the absorber film 7 using the resist pattern 8a as a mask. Furthermore, a gas selected from a chlorine-based gas such as $Cl_2$, $SiCl_4$ or $CHCl_3$, a mixed gas containing a chlorine-based gas and $O_2$ at a prescribed ratio, a mixed gas containing a chlorine-based gas and He at a prescribed ratio, a mixed gas containing a chlorine-based gas and Ar at a prescribed ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$ or $F_2$, or a mixed gas containing a fluorine-based gas and $O_2$ at a prescribed ratio, can be used as etching gas. Here, if oxygen is contained in the etching gas at the final stage of etching, surface roughening occurs in the Ru-based protective film 6. Consequently, etching gas not containing oxygen is preferably used at the over-etching stage when the Ru-based protective film 6 is exposed to etching.

Subsequently, the absorber film 7 having a desired circuit pattern formed thereon is fabricated by removing the resist pattern 8a by ashing or a resist stripper.

Furthermore, although the explanation here indicates the case of using the resist pattern 8a as an etching mask, the absorber pattern 7a having a desired circuit pattern formed thereon can also be fabricated using an etching hard mask. In this case, the etching hard mask is formed on the absorber film 7 after which the resist film 8 is further formed thereon. A film that allows etching selectivity with respect to the absorber film 7 is selected for the etching hard mask. A prescribed resist pattern 8a is formed by drawing (exposing) a desired pattern such as a circuit pattern on this resist film 8 followed by developing and rinsing. A hard mask pattern is then formed by dry-etching the etching hard mask film using this resist pattern 8a as a mask followed by removing the resist pattern 8a by ashing or a resist stripper. Subsequently, the absorber pattern 7a having a desired circuit pattern formed thereon is fabricated by dry-etching the absorber film 7 using this hard mask pattern as a mask. Subsequently, the hard mask pattern is removed by wet etching or dry etching.

In addition, a method may also be employed in which the absorber film 7 is etched with a hard mask pattern provided with a resist pattern instead of removing the resist pattern 8a immediately after having formed the hard mask pattern. In this case, the resist pattern 8a is automatically removed when etching the absorber film 7, thereby demonstrating the characteristic of simplifying the fabrication process. On the other hand, in the case of a method in which the absorber film 7 is etched by using the hard mask pattern from which the resist pattern 8a has been removed as a mask, there is no change in the organic product (outgas) from the resist that is eliminated during the course of etching, thereby resulting in the characteristic of stable etching.

Next, the resist film 9 is formed. Resist pattern 9b for forming a light shielding band is formed by drawing (exposing) a light shielding band pattern on this resist film 9 followed by developing and rinsing.

The reflective mask 200 of the present invention can have a light shielding band portion 11, from which the absorber film 7 and multilayer reflective film 5 have been removed, outside a transfer pattern region where the absorber pattern is formed. The light shielding band portion 11 is provided for adequately reducing the effect of reflectance of exposure carried out adjacent thereto with not only a phase shift film-type mask, but also an absorber film-type mask in the EUV reflective mask 200. Namely, the light shielding band portion 11 is a light shielding frame (region) provided so as to surround the transfer pattern region (circuit pattern region) of a mask and is provided to prevent the escape of exposure light into a region adjacent to the block undergoing pattern transfer onto the wafer, such as a transfer pattern region transferred and formed adjacent thereto. The transfer pattern region is a region measuring, for example, 132 mm×132 mm based on the center of the reflective mask blank. The reflective mask 200 of the present invention is able to adequately reduce out-of-band light caused by reflection from the light shielding band portion 11. Furthermore, the base film 3 is required to be present in the light shielding band portion 11 in order to reduce out-of-band light. Consequently, when forming the light shielding band portion 11, it is necessary to interrupt etching of the multilayer reflective film 5 with the base film 3 remaining on the substrate 1.

Next, after dry-etching the absorber film 7 according to the previously described method using the resist pattern 9a for forming the light shielding band portion 11, the protective film 6 and the multilayer reflective film 5 are also dry etched. Here, a mixed gas containing $O_2$ in a chloride-based gas such as $Cl_2$, $SiCl_4$ or $CHCl_3$ is used for the etching gas when etching the protective film 6 and the multilayer reflective film 5. In the case the protective film 6 is a Ru-based material, the protective film 6 and the multilayer reflective film 5 can be etched collectively by dry-etching with a mixed gas containing $O_2$ in a chlorine-based gas. Consequently, this method is characterized by having high production efficiency.

Furthermore, the protective film 6 and the multilayer reflective film 5 can also be dry-etched using different etching gases instead of etching collectively. For example, the protective film 6 may be dry-etched using a mixed gas of $O_2$ and $Cl_2$ or a mixed gas of $O_2$ and a Br-based gas, and the multilayer reflective film 5 may be dry-etched using $Cl_2$ gas. In addition, the etching gas can also be changed at an intermediate point during dry etching of the multilayer reflective film 5. For example, the upper portion of the multilayer reflective film 5 may be etched with a chlorine-based gas and the lower portion of the multilayer reflective film 5 may be dry-etched with a mixed gas of a chlorine-based gas and $O_2$ gas by introducing $O_2$ gas at an intermediate point during etching of the upper portion of the multilayer reflective film 5.

Subsequently, a desired light shielding band pattern (light shielding band portion 11) is fabricated by removing the resist pattern by ashing or with a resist stripper. Subsequently, an EB defect inspection and wet cleaning using an acidic or alkaline aqueous solution are carried out to suitably correct mask defects.

The reflective mask 200 of the present invention can be obtained according to the aforementioned process.

<Method of Manufacturing Semiconductor Device>

The present invention is method of manufacturing a semiconductor device having a step for forming a transfer pattern on a transferred substrate by using the aforementioned reflective mask 200 and carrying out a lithographic process using an exposure apparatus. According to the method of manufacturing a semiconductor device of the present invention, a semiconductor device having a fine and highly precise transfer pattern can be manufactured since out-of-band light generated during pattern transfer can be reduced.

More specifically, a desired transfer pattern can be formed on the semiconductor substrate 1 by using the reflective mask 200 of the aforementioned embodiment and carrying out EUV exposure. A semiconductor device having a desired electronic circuit formed thereon can be manufactured at high yield by going through various steps, such as etching of the film to be processed, forming an insulating film and conductive film, introducing a dopant or annealing, in addition to this lithography step.

EXAMPLES

The following provides an explanation of various embodiments with reference to the drawings.

Example 1

In Example 1, the mask blank substrate 120 was fabricated having the back side conductive film 2 formed on the main surface on the opposite side of the side having the base film 3 formed thereon in the mask blank substrate 120 having the base film 3 formed thereon as shown in FIG. 2. Table 1 indicates the materials and film thicknesses of the base film 3 and the back side conductive film 2 of the mask blank substrate 120 of Example 1. The mask blank substrate 120 of Example 1 was fabricated in the manner indicated below.

((Substrate 1))

A 6025-size (approx. 152 mm×152 mm×6.35 mm) low thermal expansion glass substrate in the form of a $SiO_2$—$TiO_2$ glass substrate, in which both the first main surface and second main surface were polished, was prepared for use as the substrate 1. Polishing, consisting of a rough polishing step, precision polishing step, local processing step and touch-up polishing step, was carried out so as to obtain flat and smooth main surfaces.

Figure 8:
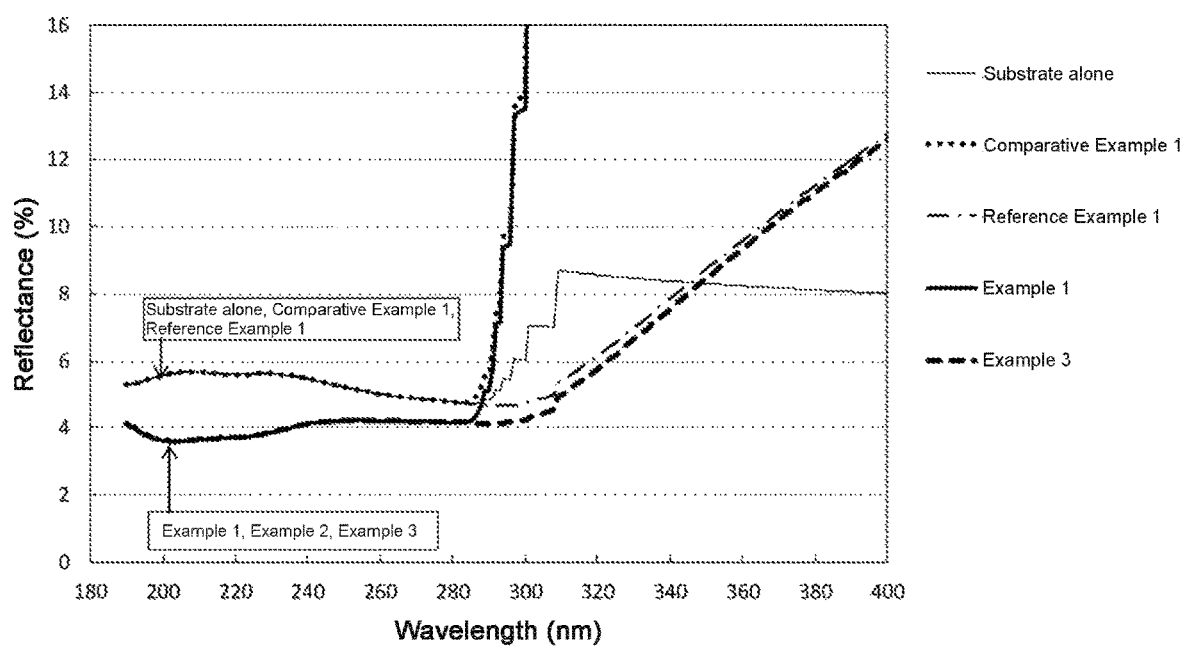
FIG. 8 is a graph indicating the wavelength dependency of reflectance in examples, comparative example, reference example and a substrate alone of the present invention.

Reflectance of the substrate 1 alone (substrate only) fabricated in this manner was measured. FIG. 8 indicates the wavelength dependency of reflectance over a wavelength range of 180 nm to 400 nm. The maximum value of reflectance over a wavelength range of 190 nm to 280 nm along with the maximum value of reflectance over a wavelength range of more than 280 nm to 320 nm were as shown in Table 1.

((Back Side Conductive Film 2))

The back side conductive film 2 composed of CrN was formed under the following conditions by magnetron sputtering (reactive sputtering) on the second main surface (back side) of the $SiO_2$—$TiO_2$-based glass substrate 1. Back side conductive film 2 formation conditions: Cr target, Ar and N$_2$ mixed gas atmosphere (Ar: 90 at %, N: 10 at %), film thickness: 20 nm.

((Base Film 3))

Next, the base film 3 composed of an SiO$_2$ film having a film thickness of 20 nm was formed on the main surface (first main surface) of the substrate 1 on the opposite side from the side on which the back side conductive film 2 was formed by carrying out ion beam sputtering using an SiO$_2$ target in an Ar gas atmosphere as shown in Table 1. Here, Si and O sputtered particles were injected at an angle of 30 degrees relative to normal of the main surface of the substrate 1. When the refractive index and extinction coefficient over a wavelength range of 190 nm to 320 nm were measured using a sample fabricated through formation of the base film 3 using the same method, the values were within the ranges shown in Table 1.

Reflectance was measured for the mask blank substrate 120 of Example 1. FIG. 8 indicates the wavelength dependency of reflectance over a wavelength range of 180 nm to 400 nm in Example 1. The maximum value of reflectance over a wavelength range of 190 nm to 280 nm along with the maximum value of reflectance over a wavelength range of more than 280 nm to 320 nm were as shown in Table 1.

Example 2

In Example 2, the mask blank substrate 120 having the base film 3 formed on the first main surface of the substrate 1 and the back side conductive film 2 formed on the second main surface of the substrate 1 was fabricated in the same manner as Example 1 with the exception of making the film thickness of the base film 3 to be 12 nm. Table 1 indicates the materials and film thicknesses of the base film 3 and the back side conductive film 2 of the mask blank substrate 120 of Example 2.

Reflectance was measured for the mask blank substrate 120 of Example 2. The maximum value of reflectance over a wavelength range of 190 nm to 280 nm along with the maximum value of reflectance over a wavelength range of more than 280 nm to 320 nm were as shown in Table 1.

Example 3

In Example 3, the mask blank substrate 120 having the base film 3 formed on the first main surface of the substrate 1 and the intermediate film 4 and the back side conductive film 2 formed on the second main surface of the substrate 1 was fabricated in the same manner as Example 1 with the exception of forming the prescribed intermediate film 4 between the substrate 1 and the back side conductive film 2 and making the back side conductive film 2 to be a TaBN film having a film thickness of 70 nm. Table 1 indicates the materials and film thicknesses of the base film 3, the intermediate film 4 and the back side conductive film 2 of the mask blank substrate 120 of Example 3.

((Intermediate Film 4))

The intermediate film 4 of Example 3 was formed in the manner indicated below. Namely, the intermediate film 4 composed of TaBO was formed under the following conditions by magnetron sputtering (reactive sputtering) on the second main surface (back side) of the SiO$_2$—TiO$_2$-based glass substrate 1. Intermediate film 4 formation conditions: TaB target (atomic ratio: 80:20), Ar and O$_2$ mixed gas atmosphere (Ar: 67% of flow rate, O$_2$: 33% of flow rate), film thickness: 22 nm.

((Back Side Conductive Film 2))

The back side conductive film of Example 3 was formed in the manner indicated below. Namely, the back side conductive film 2 composed of TaBN was formed under the following conditions by magnetron sputtering (reactive sputtering) on the second main surface (back side) of the SiO$_2$—TiO$_2$-based glass substrate 1 having the intermediate film 4 formed thereon. Back side conductive film 2 formation conditions: TaB target (atomic ratio: 80:20), Xe and N$_2$ mixed gas atmosphere (Xe: 66% of flow rate, N$_2$: 34% of flow rate), film thickness: 70 nm.

Reflectance was measured for the mask blank substrate 120 of Example 3. FIG. 8 indicates the wavelength dependency of reflectance over a wavelength range of 180 nm to 400 nm in Example 3. The maximum value of reflectance over a wavelength range of 190 nm to 280 nm along with the maximum value of reflectance over a wavelength range of more than 280 nm to 320 nm were as shown in Table 1.

Comparative Example 1

In Comparative Example 1, the mask blank substrate 120 having the back side conductive film 2 formed on the second main surface of the substrate 1 was fabricated in the same manner as Example 1 with the exception of not forming the base film 3. Table 1 indicates the material and film thickness of the back side conductive film 2 of the mask blank substrate 120 of Comparative Example 1.

Reflectance was measured for the mask blank substrate 120 of Comparative Example 1. FIG. 8 indicates the wavelength dependency of reflectance over a wavelength range of 180 nm to 400 nm in Comparative Example 1. The maximum value of reflectance over a wavelength range of 190 nm to 280 nm along with the maximum value of reflectance over a wavelength range of more than 280 nm to 320 nm were as shown in Table 1.

Reference Example 1

In Reference Example 1, the mask blank substrate 120 having the intermediate film 4 and the back side conductive film 2 formed on the second main surface of the substrate 1 was fabricated in the same manner as Example 3 with the exception of not forming the base film 3. Table 1 indicates the materials and film thicknesses of the intermediate film 4 and the back side conductive film 2 of the mask blank substrate 120 of Reference Example 1.

Reflectance was measured for the mask blank substrate 120 of Reference Example 1. FIG. 8 indicates the wavelength dependency of reflectance over a wavelength range of 180 nm to 400 nm in Reference Example 1. The maximum value of reflectance over a wavelength range of 190 nm to 280 nm along with the maximum value of reflectance over a wavelength range of more than 280 nm to 320 nm were as shown in Table 1.

(Results of Measuring Reflectance)

As is clear from Table 1 and FIG. 8, reflectance of the substrate alone, Comparative Example 1 and Reference Example 1 demonstrated similar values over a wavelength range of about not more than 280 nm. In addition, as is clear from Table 1 and FIG. 8, reflectance of Example 1 and Example 3 demonstrated similar values over a wavelength range of about not more than 280 nm.

As is clear from Table 1 and FIG. 8, when Example 1 is compared with the substrate alone and Comparative Example 1, in contrast to the maximum value of reflectance over a wavelength range of 190 nm to 280 nm of the substrate alone and Comparative Example 1 being 5.7%, the maximum value of reflectance over a wavelength range of 190 nm to 280 nm of Example 1 was low at 4.2%. This indicates that out-of-band light over a wavelength range of 190 nm to 280 nm can be reduced by the presence of the base film 3. In addition, based on a comparison between the substrate alone and Comparative Example 1, reflectance over a wavelength range of more than 280 nm to 320 nm can be seen to increase due to the presence of the back side conductive film 2.

As is clear from Table 1 and FIG. 8, when Example 3 is compared with Reference Example 1, in contrast to the maximum value of reflectance over a wavelength range of 190 nm to 280 nm of Reference Example 1 being 5.7%, the maximum value of reflectance over a wavelength range of 190 nm to 280 nm of Example 3 was low at 4.2%. This indicates that out-of-band light over a wavelength range of 190 nm to 280 nm can be reduced due to the presence of the base film 3.

As is clear from Table 1, when Example 2 is compared with Comparative Example 1, in contrast to the maximum value of reflectance over a wavelength range of 190 nm to 280 nm of Comparative Example 1 being 5.7%, the maximum value of reflectance over a wavelength range of 190 nm to 280 nm of Example 2 was low at 4.8%. This indicates that out-of-band light over a wavelength range of 190 nm to 280 nm can be reduced even by the presence of a comparatively thin base film 3 having a film thickness of 12 nm.

As is clear from Table 1 and FIG. 8, when a comparison is made between Reference Example 1 and Example 3, in which the intermediate film 4 is present, and Comparative Example 1 and Example 1, which have the back side conductive film 2 but in which the intermediate film 4 is not present, in the case of Reference Example 1 and Example 3, reflectance over a wavelength range of more than 280 nm can be seen to decrease considerably. This indicates that out-of-band light over a wavelength range of more than 280 nm to 320 nm reflected by the back side conductive film 2, as well as out-of-band light over a wavelength range of more than 280 nm to 400 nm, can be reduced due to the presence of the intermediate film 4.

As is clear from Table 1 and FIG. 8, in the case of Example 3 in which both the base film 3 and the intermediate film 4 are present, both reflectance over a wavelength range of 190 nm to 280 nm and reflectance over a wavelength range of more than 280 nm can be seen to decrease considerably. This indicates that out-of-band light over a wavelength range of 190 nm to 280 nm, as well as that over a wavelength range of 190 nm to 400 nm, can be reduced due to the presence of both the base film 3 and the intermediate film 4.

(Reflective Mask Blank 100)

The reflective mask blank 100 can be fabricated using the mask blank substrate 120 of the aforementioned Examples 1 to 3. The following provides an explanation of a method of fabricating the reflective mask blank 100.

((Multilayer Reflective Film 5))

The multilayer reflective film 5 was formed on the base film 3 on the first main surface of the aforementioned mask blank substrate 120. Namely, the multilayer reflective film 5 was continuously formed in a vacuum starting from the step for forming the base film 3. This multilayer reflective film 5 was made to be in the form of a cyclically laminated reflective film 5 composed of Si and Mo in order to obtain the multilayer reflective film 5 suitable for EUV light having a wavelength of 13.5 nm. The multilayer reflective layer 5 was formed by alternately laminating a Si layer and a Mo layer on the base film 3 by ion beam sputtering using a Si target and Mo target in an Ar gas atmosphere. Here, Si and Mo sputtered particles were injected at an angle of 30 degrees relative to normal of the main surface of the substrate 1. First, a Si film was deposited at a film thickness of 4.2 nm followed by depositing a Mo film at a film thickness of 2.8 nm. When the deposition of this Si film and Mo film is defined as one cycle, the multilayer reflective film 5 was formed by laminating for 40 cycles followed by finally depositing the Si film at a film thickness of 4.0 nm. Thus, the material of the multilayer reflective film 5 in contact with the lowermost layer with the multilayer reflective film 5, namely the base film 3, is Si, and the material of the multilayer reflective film 5 in contact with the uppermost layer of the multilayer reflective film 5, namely the protective film 6, is also Si. Furthermore, although the Si film and Mo film are described above as having been deposited for 40 cycles, the number of deposition cycles is not limited thereto, but rather the Si film and Mo film may be deposited for, for example, 60 cycles. In the case of depositing for 60 cycles, although the number of steps increases beyond that in the case of depositing for 40 cycles, reflectance with respect to EUV light can be enhanced.

((Protective Film 6))

Continuing, the protective film 6 composed of Ru was deposited at a film thickness of 2.5 nm by ion beam sputtering using a Ru target in an Ar gas atmosphere. Here, Ru sputtered particles were injected at an angle of 30 degrees relative to normal of the main surface of the substrate 1. The protective film 6 was subsequently subjected to annealing at 130° C. in air.

((Absorber Film 7))

The absorber film 7 was formed by DC sputtering to be composed of a two-layer film obtained by laminating a lower layer absorber film 71 in the form of a TaBN film having a film thickness of 56 nm and an upper layer absorber film 72 in the form of a TaBO film having a film thickness of 14 nm. The TaBN film was formed by reactive sputtering using a TaB target in a mixed gas atmosphere of Ar gas and $N_2$ gas. The TaBO film was formed by reactive sputtering using a TaB target in a mixed gas atmosphere of Ar gas and $O_2$ gas. In addition to undergoing little change over time, the TaBO film of this thickness improves inspection sensitivity by functioning as an anti-reflective film during mask pattern inspections using light. Methods that combine the use of a light-based mask pattern inspection are frequently used for reasons relating to throughput even in cases of carrying mask pattern inspections with EB. Namely, mask pattern inspections using EB demonstrating a high level of inspection sensitivity are carried out for regions where fine patterns like those found in memory cells are used, while mask pattern inspections using light demonstrating high throughout are carried out for regions composed of comparatively large patterns in the manner of indirect peripheral circuits.

The reflective mask blank 100 was fabricated using the mask blank substrates 120 of Examples 1 to 3 in the manner previously described.

(Reflective Mask 200)

Figure 6:
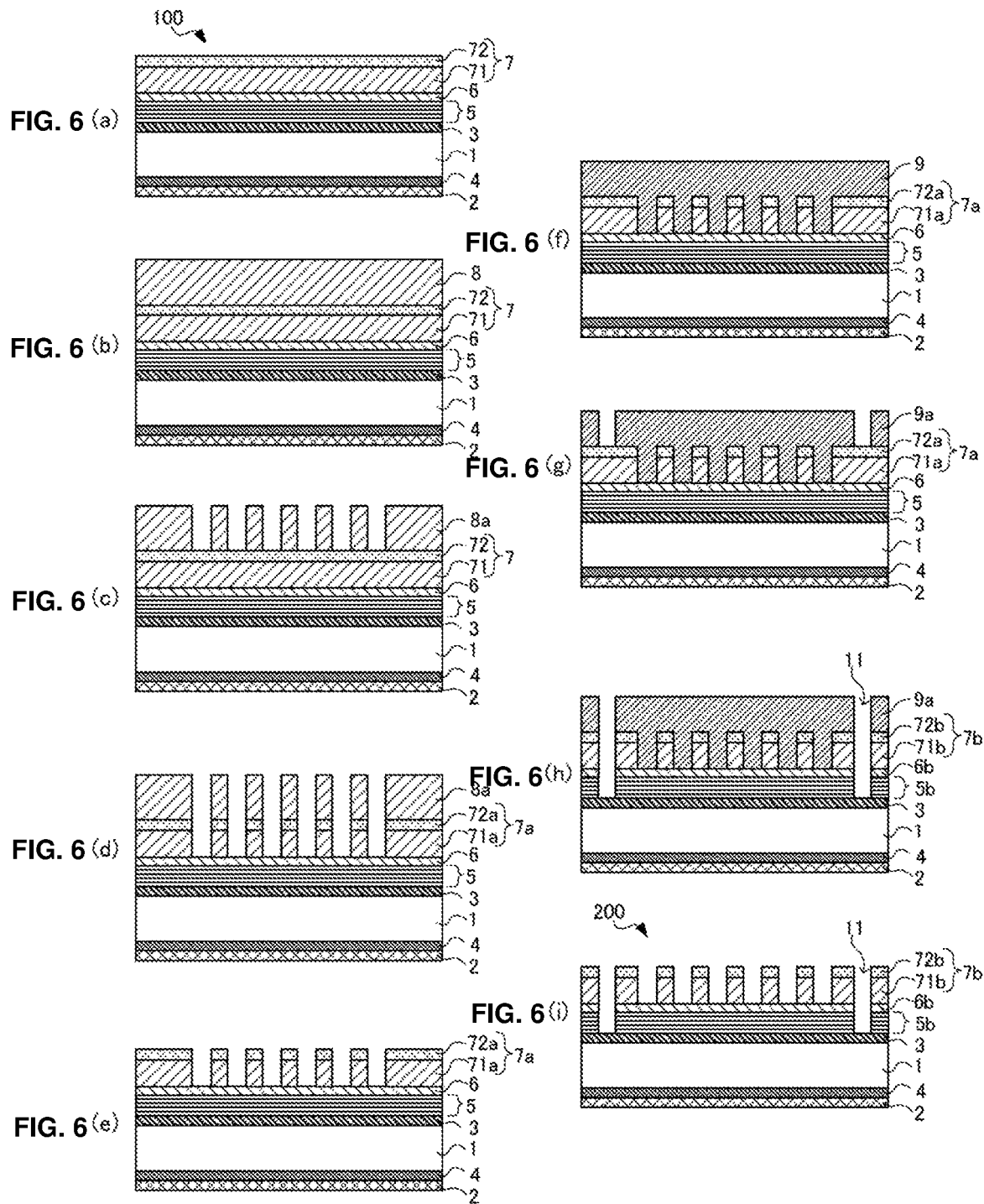
FIGS. 6(a)-6(i) illustrate several steps of a process for fabricating the reflective mask of the present invention with a cross-sectional schematic diagram.

Next, the reflective mask blank 200 was fabricated using the aforementioned reflective mask blank 100. An explanation of a method of fabricating the reflective mask 200 is explained with reference to FIG. 6 using as an example the case of fabricating the reflective mask 200 from the reflective mask blank 100 using the mask blank substrate 120 of Example 3. The reflective mask 200 can also be similarly fabricated in the case of using the reflective mask blank 100 using the mask blank substrates 120 of Examples 1 and 2.

First, the resist film 8 was formed on the upper layer absorber film 72 of the reflective mask blank 100 as shown in FIG. 6(b). A desired pattern such as a circuit pattern was drawn (exposed) on this resist film 8 followed by developing and rinsing to form the prescribed resist pattern 8a (FIG. 6(c)). Next, the first absorber pattern 7a was formed by dry etching a TaBO film (upper layer absorber film 72) using the resist pattern 8a as a mask and using $CF_4$ gas, followed by dry etching a TaBN film (lower layer absorber film 71) using $Cl_2$ gas (FIG. 6(d)). The protective film 6 composed of Ru demonstrates extremely high dry etching resistance with respect to $Cl_2$ gas and is an adequate etching stopper. Subsequently, the resist pattern 8a was removed by ashing and/or a resist stripper (FIG. 6(e)).

Subsequently, the resist film 9 was formed on the reflective mask blank 100 having the first absorber pattern 7a formed thereon (FIG. 6(f)). A light shielding band pattern was then drawn (exposed) in this resist film 9 followed by developing and rinsing to form the prescribed light shielding band resist pattern 9a (FIG. 6(g)). Next, a second pattern having the light shielding band portion 11 formed therein was formed by dry etching a TaBO film using the resist pattern 9a as a mask and using $CF_4$ gas, a TaBN film using $Cl_2$ gas, and the protective film 6 and the multilayer reflective film 5 using a mixed gas of $Cl_2$ and $O_2$ (FIG. 6(h)). As shown in FIG. 6(h), this second pattern is composed of the absorber pattern 7b, comprised of a two-layer pattern consisting of the upper layer absorber pattern 72b and the lower layer absorber pattern 71b, the protective film pattern 6b and the multilayer reflective film pattern 5b. The base film 3 is a thin film of a silicon compound as previously described. This material demonstrates an extremely effective etching stopper function with respect to a mixed gas of $Cl_2$ and $O_2$ and the reduction in film thickness is extremely small. Subsequently, the resist pattern 8b was removed by ashing and/or a resist stripper followed by cleaning with a sulfuric acid/hydrogen peroxide mixture (SPM) and wet cleaning with an alkaline aqueous solution to fabricate the reflective mask 200 (FIG. 6(i)). Subsequently, mask defects were suitably corrected as necessary by carrying out an EB defect inspection on the mask pattern.

Figure 7:
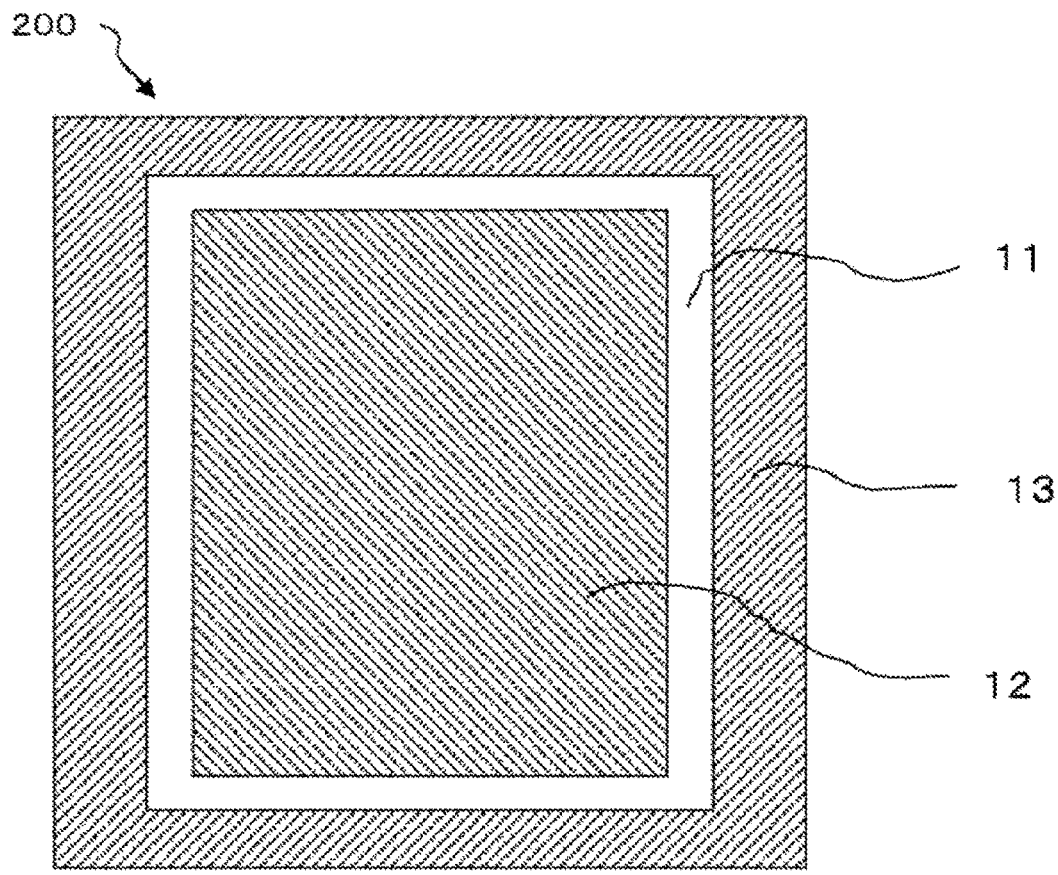
FIG. 7 is an overhead schematic diagram of the reflective mask of the present invention.

A top view of the reflective mask 200 fabricated according to the previously described method is shown in FIG. 7.

(Manufacturing of Semiconductor Device)

The reflective mask 200 fabricated using the mask blank substrates 120 of Examples 1 to 3 was placed in an EUV scanner and EUV exposure was carried out on a wafer having a film to be processed and a resist film formed on a semiconductor substrate. A resist pattern was formed on the semiconductor substrate having the film to be processed formed thereon by developing this exposed resist film.

Since the reflective mask 200 fabricated using the mask blank substrates 120 of Examples 1 to 3 is capable of reducing out-of-band light during pattern transfer, fine and highly precise transfer patterns were able to be formed. In addition, reflectance with respect to light having a wavelength of 130 nm to 280 nm in the light shielding band portion 11 was not more than 5%, out-of-band light reflected from the light shielding band portion 11 was sufficiently low, and transfer accuracy was high.

A semiconductor device having desired properties was able to be manufactured at high yield by transferring this resist pattern to the film to be processed by etching and subsequently going through various steps such as the formation of an insulating film and conductive film, introduction of a dopant, or annealing.

TABLE 1

|  |  | Substrate Alone | Comparative Example 1 | Reference Example 1 | Example 1 | Example 2 | Example 3 |
|---|---|---|---|---|---|---|---|
| Base film | Material | — | — | — | $SiO_2$ | $SiO_2$ | $SiO_2$ |
|  | Film thickness (nm) | — | — | — | 20 | 12 | 20 |
|  | Refractive index (190-320 nm) | — | — | — | 1.48~1.57 | 1.48~1.57 | 1.48~1.57 |
|  | Extinction coefficient (190-320 nm) | — | — | — | 0 | 0 | 0 |
| Intermediate film | Material | — | — | TaBO | — | — | TaBO |
|  | Film thickness (nm) | — | — | 22 | — | — | 22 |
| Back side conductive film | Material | — | CrN | TaBN | CrN | CrN | TaBN |
|  | Film thickness (nm) | — | 20 | 70 | 20 | 20 | 70 |
| Reflectance (%) | Max. value at 190 nm to 280 nm | 5.7 | 5.7 | 5.7 | 4.2 | 4.8 | 4.2 |
|  | Max. value at more than 280 nm to 320 nm | 8.7 | 32.9 | 6.1 | 32.7 | 32.9 | 5.8 |

BRIEF DESCRIPTION OF THE REFERENCE SYMBOLS

1 Substrate
2 Back side conductive film
3 Base film
4 Intermediate film
5 Multilayer reflective film
5b Multilayer reflective film pattern
6 Protective film
6b Protective film pattern
7 Absorber film
7a First absorber pattern
7b Second absorber pattern
8 Resist film
8a Resist pattern
9 Resist film
9a Resist pattern
11 Light shielding band portion
12 Transfer pattern region 13 Peripheral region
71 Absorber film (lower layer absorber film)
71a Absorber pattern (lower layer absorber pattern)
71b Absorber pattern (lower layer absorber pattern)
72 Absorber film (upper layer absorber film)
72a Absorber pattern (upper layer absorber pattern)
72b Absorber pattern (upper layer absorber pattern)
100 Reflective mask blank
110 Substrate with multilayer reflective film
120 Mask blank substrate
200 Reflective mask

The invention claimed is:

1. A mask blank substrate provided with a base film on a substrate, wherein:
   the base film is formed with a material having a refractive index smaller than the substrate over a wavelength range of not less than 190 nm to not more than 280 nm,
   reflectance of the base film arranged on a first main surface of the substrate is smaller than the reflectance of the substrate over a wavelength range of not less than 190 nm to not more than 280 nm, and
   the film thickness of the base film is 6 nm to 25 nm.

2. The mask blank substrate according to claim 1, wherein the reflectance of the base film arranged on the first main surface of the substrate is not more than 5%.

3. The mask blank substrate according to claim 1, wherein the refractive index of the base film is less than 1.6.

4. The mask blank substrate according to claim 1, wherein the base film is composed of a material containing a silicon compound.

5. The mask blank substrate according to claim 1, comprising:
   a back side conductive film formed on a side of the substrate that is opposite to the first main surface, and an intermediate film provided between the substrate and the back side conductive film, wherein,
   the reflectance of the base film arranged on the first main surface of the substrate over a wavelength range of more than 280 nm to not more than 320 nm is not more than 10%.

6. The mask blank substrate according to claim 5, wherein the reflectance of the base film arranged on the first main surface of the substrate over a wavelength range of more than 280 nm to not more than 400 nm is not more than 15%.

7. The mask blank substrate according to claim 5, wherein the intermediate film is composed of a material containing tantalum, boron and oxygen.

8. The mask blank substrate according to claim 5, wherein the film thickness of the intermediate film is 2 nm to 40 nm.

9. A substrate with multilayer reflective film comprising a multilayer reflective film that reflects exposure light on the base film in the mask blank substrate according to claim 1.

10. The substrate with multilayer reflective film according to claim 9, comprising a protective film on the multilayer reflective film.

11. A reflective mask blank comprising an absorber film on the multilayer reflective film of the substrate with multilayer reflective film according to claim 9.

12. A reflective mask comprising an absorber pattern on the multilayer reflective film obtained by patterning the absorber film of the reflective mask blank according to claim 11.

13. The reflective mask blank according to claim 12, comprising a light shielding band, from which the absorber film and the multilayer reflective film are removed, outside a transfer pattern region where the absorber pattern is formed.

14. A method of manufacturing a semiconductor device comprising a step for carrying out a lithographic process using an exposure apparatus using the reflective mask according to claim 12 to form a transfer pattern on a transferred substrate.

15. A reflective mask blank comprising an absorber film on the protective film of the substrate with multilayer reflective film according to claim 10.

16. A method of manufacturing a semiconductor device comprising a step for carrying out a lithographic process using an exposure apparatus using the reflective mask according to claim 13 to form a transfer pattern on a transferred substrate.

* * * * *